(12) United States Patent
Minogue

(10) Patent No.: US 6,506,448 B1
(45) Date of Patent: Jan. 14, 2003

(54) METHOD OF PROTECTIVE COATING BGA SOLDER ALLOY SPHERES

(75) Inventor: Gerard R. Minogue, Kinnelon, NJ (US)

(73) Assignee: Fry's Metals, Inc., Jersey City, NJ (US)

( * ) Notice: Subject to any disclaimer, the term of this patent is extended or adjusted under 35 U.S.C. 154(b) by 33 days.

(21) Appl. No.: 09/584,674

(22) Filed: May 31, 2000

Related U.S. Application Data

(60) Provisional application No. 60/137,031, filed on Jun. 1, 1999.

(51) Int. Cl.[7] .................................................. B05D 7/00
(52) U.S. Cl. ..................... 427/216; 427/212; 427/220; 427/255.6
(58) Field of Search ........................... 427/215, 216, 427/220, 255.6; 257/772; 361/743; 438/612; 228/180.21, 180.22, 207

(56) References Cited

U.S. PATENT DOCUMENTS

| | | | |
|---|---|---|---|
| 3,950,579 A | * 4/1976 | Wallace | 264/211.24 |
| 4,701,354 A | * 10/1987 | Kitamura et al. | 427/255.6 |
| 4,994,326 A | * 2/1991 | Shimmura et al. | 428/405 |
| 5,390,082 A | 2/1995 | Chase et al. | 361/783 |
| 5,409,157 A | 4/1995 | Nagesh et al. | 228/180.22 |
| 5,736,074 A | 4/1998 | Hayes et al. | 264/6 |
| 5,872,400 A | 2/1999 | Chapman et al. | 257/738 |
| 6,066,197 A | * 5/2000 | Bristol et al. | 106/14.42 |
| 6,194,085 B1 | * 2/2001 | Fasano et al. | 428/620 |
| 6,306,514 B1 | * 10/2001 | Weikel et al. | 428/195 |

FOREIGN PATENT DOCUMENTS

| | | | |
|---|---|---|---|
| EP | 0 539 211 A | 4/1993 | H01L/21/60 |
| EP | 0 556 864 A | 8/1993 | B23K/35/14 |
| EP | 0 556 864 A1 * | 8/1993 | |
| EP | 0 905 775 A | 3/1999 | H01L/23/498 |
| WO | WO 97 01414 A | 1/1997 | B23K/35/14 |

* cited by examiner

Primary Examiner—Shrive P. Beck
Assistant Examiner—Rebecca A. Blanton
(74) Attorney, Agent, or Firm—Mintz, Levin, Cohn, Ferris, Glovsky and Popeo, P.C.

(57) ABSTRACT

A method of efficiently coating surfaces of solder alloy spheres by a vapor deposition process using a solvent-based coating solution including a low viscosity organic material and at least one solute, such as a surfactant. The method surface coats solder alloy spheres to minimize or eliminate physical and chemical damage to surfaces of spheres prior to use in surface mounting applications.

41 Claims, 1 Drawing Sheet

METHOD OF PROTECTIVE COATING BGA SOLDER ALLOY SPHERES

CLAIM OF PRIORITY

This application claims priority under 35 U.S.C. §119(e) to U.S. Provisional patent application Serial No. 60/137,031, filed on Jun. 1, 1999, incorporated herein by reference.

TECHNICAL FIELD OF THE INVENTION

The invention relates generally to coated spheres and methods of making same. More particularly, the invention relates to the method of applying a protective coating to solder alloy spheres by a process of vapor deposition.

BACKGROUND OF THE INVENTION

Electrical components such as resisters, capacitors, inductors, transistors, integrated circuits, chip carriers and the like are typically mounted on circuit boards and other electronic substrates by one of two methods that are well known in the electronics assembly industries. A first method includes mounting the components to a first side of a circuit board. Leads from the components extend through holes formed in the circuit board and are soldered on an opposing side of the board. A second method includes soldering components on the same side of the printed circuit board to which they are mounted. These latter components are said to be "surface-mounted" to circuit boards.

Surface mounting electronic components to circuit boards and other electronic substrates is a desirable method in that the method may be used to fabricate very small circuit structures. In addition, surface mounting lends itself well to process automation. In high-density electronic manufacturing processes, surface mountable microelectronic devices are bonded to a substrate by a solder reflow process. One type of surface mountable device, commonly referred to as a "flip chip," comprises an integrated circuit device having numerous connecting leads that are attached to pads mounted on the underside of the device. With the use of flip chips, either the circuit board or the chip is provided with small bumps or balls of solder (hereinafter referred to as "spheres" or "solder spheres") that are positioned in locations which correspond to the pads on the underside of the chip and on the surface of the circuit board. The solder spheres are formed prior to the reflow process by any of various prior art processes which include deposition through a mask, electroplating, pick-and-place, evaporation, sputtering, and screen printing.

The chip is mounted to the circuit board or other electronic substrate by (a) placing it in contact with the board such that the solder spheres become sandwiched between the pads on the board and the corresponding pads on the chip forming an assembly; (b) heating the assembly to a point at which the solder reflows; and (c) cooling the assembly. Upon cooling, the solder hardens, thereby mounting the flip chip to the surface of the circuit board.

Tolerances in devices using flip chip technology are critical, as the spacing between individual devices as well as the spacing between the chip and the circuit board is typically very small. For example, spacing of such chips from the surface of the board is typically in the range of 0.5 to 3.0 mil and is expected to approach micron spacing in the near future.

For example, electrical connections in BGA (ball grid array) packages are made by placing solder spheres of precisely controlled diameter and unblemished surface condition between circuit pads. Solder spheres are then heated above the liquidus temperature of the solder alloy, thereby melting the solder spheres, which wets and flows onto both contact pads, creating a mechanical and an electrical contact.

Commonly used solder alloys consist of relatively soft base metals such as aluminum or copper that can be easily damaged by mechanical agitation. Such damage may result in, for example, the formation of surface flat cracks and crevices; spalling off portions of the spheres as particles or flakes; loss of the bright reflective sphere surface; increased sphere electrical contact and bulk resistivity; and an exacerbation of base metal oxidation at the sphere surface.

Damage to the solder sphere surface may produce a range of consequences. For example, automated vision system assembly hardware will not be able to distinguish a solder sphere from the background if the sphere reflectivity has been diminished. Additionally, physical surface damage will hinder the ability of most automated BGA assembly hardware to pick and place individual spheres. Furthermore, the presence of extraneous particles on the solder spheres may impair the mechanical function of the BGA assembly hardware and cause low resistivity or electrical shorts between contact pads on the microelectronic package, and impact electrical performance once the BGA joints have been created. Importantly, excessive oxide present on the solder sphere surface can impair proper wetting and flow of solder spheres into contact pads as necessary to form an adequate mechanical joint and electrical connection.

In an effort to protect solder sphere surfaces from oxidation, the production of solder spheres coated with low melting point materials such as solder or flux has previously been disclosed in U.S. Pat. Nos. 5,872,400 and 5,736,074.

However, the need remains in the art to provide a rapid and efficient method of physically protecting solder alloy spheres from mechanical damage prior to use in surface mount techniques. The present invention provides a rapid and efficient method of coating solder alloy spheres to prevent mechanical surface damage and surface oxidation of alloy metals.

SUMMARY OF THE INVENTION

The invention provides a method for applying a chemical coating to surfaces of solder alloy spheres to ameliorate or eliminate mechanical damage due to contact and collision of the solder alloy spheres with other solder spheres and side walls of containers used for storing and transporting the solder alloy spheres. In addition, chemically coating surfaces of the solder alloy spheres ameliorates or eliminates oxidation of metal alloys comprising surfaces of the solder spheres.

The method of the invention includes the step of providing a first vapor-tight chamber into which a coating solution, formulated as described herein and comprising a volatile organic solvent and at least one solute, such as a low viscosity organic material and a surfactant. The method further includes the step of providing a second chamber containing a plurality of solder spheres and immersing the second chamber into the solution contained in the first vapor-tight chamber. The solder spheres are in fluid communication with the coating solution by a plurality of apertures or perforations formed in the second chamber. The solder spheres are immersed in the coating solution for a desired predetermined residence time. In one embodiment, after expiration of the residence time, the second chamber with the solder spheres contained therein is removed from the first vapor-tight chamber and placed in a second vapor-tight chamber. The second vapor-tight chamber is heated to a temperature above a boiling point of the solvent used in the coating solution by a heating device in order to vaporize any solvent remaining that did not adhere to surfaces of the solder spheres. In addition, vaporization of excess solvent may be accomplished by decreasing a pressure in the second vapor-tight chamber. After heating the second vapor-tight chamber for a desired predetermined time, the second chamber with the solder spheres contained therein is removed.

In one embodiment, the temperature of the second vapor-tight chamber may be controlled by a thermal sensor. In another embodiment, the second vapor-tight chamber may be additionally equipped with a condenser to condense excess solvent vapors and a collection device for collecting the condensed solvent vapors for reuse.

The coating solution may include the volatile organic solvent selected from the group consisting of acetone, isopropyl alcohol, denatured ethanol, n-propyl bromide, trichloroethylene, Genesolve 2000™, Ensolv™, Asahi AK-225™ and Vaporedge 1000™.

In addition, the coating solution contains the low viscosity organic material which may be selected from the group consisting of paraffin oil, mineral oil, isostearic acid, polyolefin oil, adipic acid, silicone oil, petroleum oil and tin, and any combination thereof. The low viscosity organic material is present at a concentration of from about 0.05 percent by weight to 5.0 percent by weight (wt. %).

The surfactant of the coating solution may be selected from the group consisting of simethicone, cyclomethicone, decamethylcyclopentasiloxane, and any combination thereof. The surfactant is present at a concentration of from about 0.01 wt. % to about 1.0 wt. %.

The coating solution may further include a solvent-soluble ultraviolet UV fluorescent dye known to those skilled in the art as a fluor. A coating solution containing a fluor leaves a UV fluorescent deposit on surfaces of the solder spheres that assists to optically locate the solder spheres. The UV fluorescent dye is present at a concentration of from about 0.01 to about 0.1 wt. %.

The coating solution may also include a solvent-soluble, polar or non-polar solder flux that minimizes or eliminates the need for a separate deposition of liquid flux or flux paste onto surfaces of the solder spheres during the reflow phase of surface mounting. The solder flux is present at a concentration of from about 05 to about 1.0 wt. %.

Other advantages and features of the invention will become more readily apparent from the following detailed description taken in connection with the appended claims and accompanying drawing.

BRIEF DESCRIPTION OF THE DRAWINGS

For a better understanding of the present invention, reference is made to the drawings that are incorporated herein by reference and in which.

DETAILED DESCRIPTION OF THE INVENTION

Figure 1:
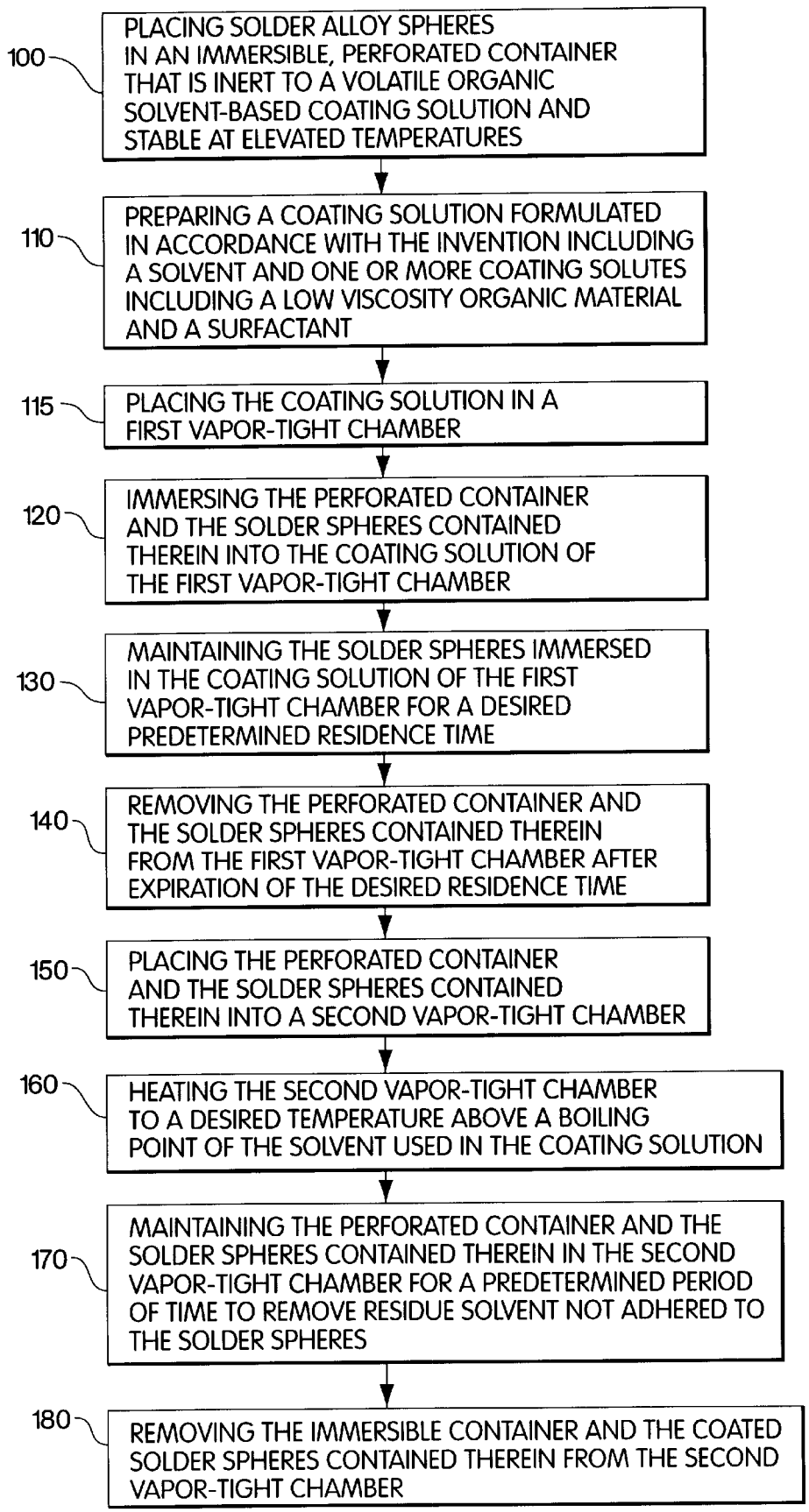
FIG. 1 is a flow diagram of a method of coating solid spheres in accordance with the invention.

Embodiments of the present invention described below provide a method for coating solder alloy spheres by a vapor deposition process. More particularly, the method protectively coats solder alloy spheres and ameliorates or eliminates mechanical damage to and oxidation of solder sphere surfaces. Those skilled in the art will appreciate, however, that embodiments in accordance with the invention are not limited to coating solder alloy spheres, but rather, may be used in other applications that require coating metallic objects to reduce or prevent mechanical and chemical surface damage.

Embodiments of the invention will be described below with reference to FIG. 1 which is presented herein for the purpose of illustrating embodiments and are not intended to limit the scope of the invention.

The spheres of the invention can be any suitable material useful as a solder sphere. For example, the solder spheres may be constructed of such materials as, although not limited to, aluminum, lead, tin, copper, gold, nickel, bismuth, gallium, silver, cobalt, cadmium, antimony, silicon, germanium, tellurium, indium and mixtures, solutions or alloys of two or more of such metals.

In a first embodiment of the invention illustrated in FIG. 1, the method of protectively coating the solder spheres includes providing an immersible container with a plurality of apertures or perforations in which the solder spheres will be contained 100 during the vapor deposition process. The plurality of apertures or perforations allows a sufficient volume of solvent to contact the solder spheres contained therein. The immersible, perforated container is constructed of material that does not react with volatile organic solvents, coating solutes, or low viscosity organic coating materials used in accordance with the invention. Furthermore, the immersible container is stable at the elevated temperatures employed in the vapor deposition process.

The coating process includes preparing a coating solution that contains a solvent and coating solutes as described herein 110. The solvent may include a volatile organic solvent that is inert to the components comprising the immersible container, such as, but not limited to, acetone, isopropyl alcohol, denatured ethanol, n-propyl bromide, trichloroethylene, Genesolve 2000™, Ensolv™, Asahi AK-225™ and Vaporedge 1000™. In addition, solvent used in the coating process does not leave a residue on surfaces of the solder spheres upon proper evaporation.

The coating solution includes a low viscosity organic material (LVOM) and a surfactant. The LVOM is present in solution at a concentration of from about 0.05 to about 5 percent by weight (wt. %). More preferably, the LVOM may be present in solution from about 0.5 to about 2 wt. %, and most preferably from about 0.1 to about 1.0 wt. %. Examples of the LVOM that may be used in the coating solution include, but are not limited to, paraffin oil, mineral oil, isostearic acid, polyolefin oil, adipic acid, silicone oil, petroleum oil and tin stearate. In addition, the LVOM may be present as a mixture of one or more types of such materials.

The surfactant is present in solution at a concentration of from about 0.01 to about 1.0 wt. %. More preferably, the surfactant may be present in solution at a concentration of from 0.05 to about 0.75 wt. %, and most preferably, at a concentration of from about 0.1 to about 0.5 wt. %. Suitable surfactants for use in the coating process include, but are not limited to, simethicone, cyclomethicone, decamethylcyclopentasiloxane, and any combination thereof.

In another embodiment, the coating solution may include ultraviolet (UV) fluorescent dyes, known in the art as fluors, which are soluble in the coating solution solvent. Use of fluors in the coating solution described herein leaves a UV fluorescent deposit on surfaces of the solder spheres. The UV fluorescent deposit aids in location of the solder spheres on a substrate with an optical character recognition system or other vision system for optically locating the solder spheres. In addition, fluors of different colors may be used to represent and identify different solder sphere alloy compositions by fluorescing in different colors upon ultraviolet stimulation. Fluors are preferably present in the coating solution at a concentration of from about 0.01 to about 0.1 wt. %.

In still another embodiment, the coating solution may further include polar and non-polar fluxes which are soluble in the coating solution solvent. The addition of flux to the coating solution helps to assist the processing of the solder spheres during the reflow process of surface mounting. A flux deposit remains on surfaces of the solder spheres after excess solvent that does not adhere to surfaces of the solder spheres is removed. The flux component of the coating solution ameliorates or eliminates the need for the separate addition of flux liquid or flux paste during the reflow process. The flux may be present in the coating solution in a concentration of from about 0.5 to about 1.0 wt. %.

In the first embodiment of the invention, the coating process further includes placing the coating solution, as described herein, in a first vapor-tight chamber 115. The coating process then includes immersing the perforated container with the solder spheres contained therein in the solution contained in the first vapor-time container for a desired predetermined residence time 120. A preferred residence time is from about 30 seconds to about 12 hours. More preferably, the residence time may be from about 30 seconds to about 10, 8, 6, 4, or 2 hours and most preferably, the residence time may be from about 1 minute to one hour. After the solder spheres are incubated for the desired residence time, the perforated container is removed from the first vapor-tight chamber 140 and placed into a second vapor-tight chamber 150. The second vapor tight chamber is fitted with a heating element capable of heating the chamber. In another embodiment, the second vapor-tight chamber may be additionally fitted with a device for monitoring the temperature of the second vapor-tight chamber, such as, but not limited to, a thermal electrode.

In the first embodiment, the second vapor-tight chamber is heated to a temperature above the boiling point of the solvent used in the coating solution in order to remove by vaporization excess coating solution solvent. In another embodiment, the second chamber is heated to a temperature of from about 54 to about 121° C. The second vapor-tight chamber is heated for a period of from 5 minutes to 10 hours. In addition, the second vapor-tight chamber may be heated more preferably from about 10 minutes to about 5 hours, and most preferably from about 15 minutes to about 2 hours. During the heating period, excess solvent that has not sufficiently adhered to surfaces of solder spheres is removed from surface coatings by vaporization 170. Vaporization yields the solder spheres protectively coated with the solutes present in the coating solution. After the heating period, the perforated container is removed from the second vapor tight chamber 180 and the solder spheres may be immediately used or stored for later use.

In another embodiment of the invention, the excess coating solution solvent that has not sufficiently adhered to the solder spheres may be removed by from the surface coatings by vaporization achieved by decreasing the internal pressure of the second vapor-tight chamber. In still another embodiment of the invention, the second vapor-tight chamber may be further fitted with a device for condensing the solvent vapors that evolve from heating the surface coatings of the solder spheres. In yet another embodiment, the second vapor-tight chamber may be additionally equipped with a cold plate or other condensing device to condense circulating solvent vapors, and a collecting device to thereafter collect the condensed solvent vapors for reuse.

The protectively coated solder spheres produced in accordance with the method of the invention may be used in many electronic applications. For example, the chemically coated solder spheres may be used in interconnect arrays, solder pastes, Z-axis conduction adhesives, etc. In addition, a coated solder sphere may be ejected or printed onto a substrate and stored without damage to the solder for reflow at a future time. Furthermore, the coating of the solder spheres maintains an oxide-free surface of the solder sphere and provides surface activation for reflow of the solder sphere when the interconnect joint is formed. The chemically coated solder spheres may also be used for flip-chip, ball grid array and fine pitch surface mount applications. The chemically coated solder spheres may also be used to produce solder pastes or the like, or may be directed onto wettable metal pads of electronic devices or the like.

The details of one or more embodiments of the invention are set forth in the accompanying description above. Although any methods and materials similar or equivalent to those described herein can be used in the practice or testing of the present invention, the preferred methods and materials are now described. Other features, objects, and advantages of the invention will be apparent from the description and from the claims. In the specification and the appended claims, the singular forms include plural referents unless the context clearly dictates otherwise. Unless defined otherwise, all technical and scientific terms used herein have the same meaning as commonly understood by one of ordinary skill in the art to which this invention belongs. All patents and publications cited in this specification are incorporated by reference.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A method of chemically coating a solder sphere by a vaporization process comprising steps of:

(a) providing a first vapor-tight chamber with a coating solution contained therein which comprises a volatile organic solvent and at least one solute;

(b) providing a plurality of solder spheres contained in a second chamber;

(c) immersing said second chamber into said first vapor-tight chamber, wherein said second chamber includes a plurality of apertures to place said second chamber in fluid communication with said first vapor-tight chamber, under conditions sufficient to allow for adherence of said solutes to said solder spheres contained therein;

(d) removing said second chamber from said first vapor-tight, chamber; and (e) immersing said second chamber into a third vapor-tight chamber to remove by vaporization said volatile organic solvent, thereby coating said solder spheres.

2. The method of claim 1, wherein said volatile organic solvent is selected from the group consisting of acetone, isopropyl alcohol, denatured ethanol, n-propyl bromide, trichloroethylene, and any combination thereof.

3. The method of claim 1, wherein said at least one solute comprises a low viscosity organic material and a surfactant.

4. The method of claim 3, wherein said low viscosity organic material is selected from the group consisting of paraffin oil, mineral oil, isostearic acid, polyolefin oil, adipic acid, silicone oil, petroleum oil and tin, and any combination thereof.

5. The method of claim 4, wherein said low viscosity organic material is present at a concentration of from about 0.05 to about 5.0 percent by weight.

6. The method of claim 5, wherein said low viscosity organic material is present at a concentration of from about 0.5 to about 2.0 percent by weight.

7. The method of claim 6, wherein said low viscosity organic material is present at a concentration of from about 0.1 to about 1.0 percent by weight.

8. The method of claim 3, wherein said surfactant is selected from the group consisting of simethicone, cyclomethicone and decamethylcyclopentasiloxane, and any combination thereof.

9. The method of claim 8, wherein said surfactant is present at a concentration of from about 0.01 to about 1.0 percent by weight.

10. The method of claim 9, wherein said surfactant is present at a concentration of from about 0.05 to about 0.75 percent by weight.

11. The method of claim 8, wherein said surfactant is present at a concentration of from about 0.1 to about 0.5 percent by weight.

12. The method of claim 1, wherein said vaporization is caused by heating.

13. The method of claim 1, wherein said vaporization is caused by decreasing a pressure in said third chamber.

14. The method of claim 12, wherein said third chamber further comprises a heating device.

15. The method of claim 14, wherein said third chamber further comprises an electrode to measure and monitor an internal temperature of said third chamber.

16. The method of claim 14, wherein said third container further comprises a condensing device.

17. The method of claim 16, further comprising steps of condensing said solvent vapors; and collecting said condensed solvent vapors.

18. The method of claim 1, wherein the coating solution further comprises a solvent-soluble ultraviolet fluorescent dye.

19. The method of claim 18, wherein the ultraviolet fluorescent dye includes a specific color.

20. The method of claim 19, wherein the ultraviolet fluorescent dye is present at a concentration of from about 0.01 to about 0.1 percent by weight.

21. A method of chemically coating a solder sphere by a vaporization process comprising. steps of:
(a) providing a first vapor-tight chamber with a coating solution contained therein which comprises a volatile organic solvent and at least one solute, wherein said coating solution further comprises a non-polar or polar, solvent-soluble solder flux;
(b) providing a plurality of solder spheres contained in a second chamber;
(c) immersing said second chamber into said first vapor-tight chamber, wherein said second chamber includes a plurality of apertures to place said second chamber in fluid communication with said first vapor-tight chamber, under conditions sufficient to allow for adherence of said solutes to said solder spheres contained therein;
(d) removing said second chamber from said first vapor-tight chamber; and
(e) immersing said second chamber into a third vapor-tight chamber to remove by vaporization said volatile organic solvent, thereby coating said solder spheres.

22. The method of claim 21, wherein the solder flux is present at a concentration of from about 0.5 to about 1.0 wt. %.

23. The method of claim 21, wherein said volatile organic solvent is selected, from the group consisting of acetone, isopropyl alcohol, denatured ethanol, n-propyl bromide, trichloroethylene, and any combination thereof.

24. The method of claim 21, wherein said at least one solute comprises a low viscosity organic material.

25. The method of claim 24, herein said low viscosity organic material is selected from the group consisting of paraffin oil, mineral oil, isostearic acid, polyolefin oil, adipic acid, silicone oil, petroleum oil and tin, and any combination thereof.

26. The method of claim 25, wherein said low viscosity organic material is present at a concentration of from about 0.05 to about 5.0 percent by weight.

27. The method of claim 21, wherein said non-polar or polar, solvent-soluble solder flux is present at a concentration sufficient to at least minimize an amount of a flux deposited on a surface with said coated solder spheres.

28. The method claim 27, wherein said non-polar or polar, solvent-soluble solder flux is present at a concentration of from about 0.5 to about 1.0 percent by weight.

29. The method of claim 21, said coating solution further comprising a surfactant.

30. The method of claim 29, said surfactant is selected from the group consisting of simethicone, cyclomethicone and decamethylcyclopentasiloxane, and any combination thereof.

31. The method of claim 30, wherein said surfactant is present at a concentration of from about 0.01 to about 1.0 percent by weight.

32. The method of claim 21, wherein said conditions sufficient to allow for adherence of said solutes to said solder spheres comprises a residence time of said second chamber immersed in said first chamber.

33. The method of claim 32, wherein said residence time comprises a range of from about 30 seconds to about 12 hours, and preferably from about 60 seconds to about 1 hour.

34. The method of claim 21, wherein said vaporization of said volatile organic solvent comprises heating said third chamber to a temperature about above a boiling temperature of said volatile organic solvent to vaporize excess of said volatile organic solvent from said solder spheres.

35. The method of claim 34, wherein said temperature comprises a temperature of from about 54° C. to about 121° C.

36. The method of claim 34, wherein heating said third chamber to a temperature about above a boiling temperature of said volatile organic solvent comprises heating said third chamber with a heating device operatively coupled to said third chamber and configured to supply heat to said third chamber.

37. The method of claim 34 further comprising maintaining said temperature of said third chamber about above a boiling temperature of said volatile organic solvent for about 5 minutes to about 10 hours, and preferably from about 15 minutes to about 2 hours.

38. The method of claim 37, wherein maintaining said temperature of said third chamber about above a boiling temperature of said volatile organic solvent comprises measuring said temperature of said third chamber with an electrode disposed within said third chamber and configured to detect said temperature of said third chamber.

39. The method of claim 34 further comprising condensing vapors of said excess of said volatile organic solvent.

40. The method of claim 39 wherein condensing said vapors comprises condensing said vapors with a cold condensing device disposed in said third vapor-tight chamber and configured to condense vapors of said volatile organic solvent.

41. The method of claim 21, wherein vaporization of said volatile organic solvent comprises reducing an internal pressure of said third chamber to remove excess of said volatile organic solvent from said solder spheres.

* * * * *

UNITED STATES PATENT AND TRADEMARK OFFICE
CERTIFICATE OF CORRECTION

PATENT NO.   : 6,506,448 B1
DATED        : January 14, 2003
INVENTOR(S)  : Gerard R. Minogue It is certified that error appears in the above-identified patent and that said Letters Patent is hereby corrected as shown below:

<u>Column 6,</u>
Line 60, change "tight, chamber" to -- tight chamber --.

<u>Column 7,</u>
Line 52, change "comprising," to -- comprising --.

<u>Column 8,</u>
Line 5, insert a paragraph break before "thereby".
Line 10, change "selected," to -- selected --.

Signed and Sealed this

Eighteenth Day of March, 2003

JAMES E. ROGAN
*Director of the United States Patent and Trademark Office*